US008440375B2

(12) United States Patent
Kiuchi et al.

(10) Patent No.: US 8,440,375 B2
(45) Date of Patent: May 14, 2013

(54) EXPOSURE METHOD AND ELECTRONIC DEVICE MANUFACTURING METHOD

(75) Inventors: Tohru Kiuchi, Higashi-Kurume (JP); Naomasa Shiraishi, Saitama (JP); Hideya Inoue, Kanagawa (JP)

(73) Assignee: Nikon Corporation, Tokyo (JP)

( * ) Notice: Subject to any disclaimer, the term of this patent is extended or adjusted under 35 U.S.C. 154(b) by 814 days.

(21) Appl. No.: 12/071,913

(22) Filed: Feb. 27, 2008

(65) Prior Publication Data
US 2008/0299492 A1    Dec. 4, 2008

Related U.S. Application Data

(60) Provisional application No. 60/924,711, filed on May 29, 2007.

(51) Int. Cl.
G03F 9/00    (2006.01)

(52) U.S. Cl.
USPC ............................................. 430/30; 430/311

(58) Field of Classification Search ................... 430/30, 430/311
See application file for complete search history.

(56) References Cited

U.S. PATENT DOCUMENTS

| | | | |
|---|---|---|---|
| 5,523,193 A | 6/1996 | Nelson | |
| 5,917,205 A | 6/1999 | Mitsui et al. | |
| 6,166,865 A | 12/2000 | Matsuyama | |
| 6,342,703 B1 | 1/2002 | Koga et al. | |
| 2003/0035090 A1* | 2/2003 | Imai et al. | 355/53 |
| 2004/0105961 A1 | 6/2004 | Carpi et al. | |

FOREIGN PATENT DOCUMENTS

| | | |
|---|---|---|
| JP | 7-183214 | 7/1995 |
| JP | 07-226360 | 8/1995 |
| JP | 7-295229 | 11/1995 |
| JP | 2000-133579 | 5/2000 |
| JP | 2000-353661 | 12/2000 |
| JP | 2003-59826 | 2/2003 |
| JP | 2003-059826 | * 9/2003 |
| WO | 2007/031105 | 3/2007 |
| WO | WO 2007-031105 | * 3/2007 |

OTHER PUBLICATIONS

Japanese Notification of Reasons for Rejection mailed Aug. 2, 2012 in Japanese Application No. 2008-087211.
Japanese Decision of Rejection mailed Nov. 15, 2012 in Japanese Application No. 2008-087211.

* cited by examiner

*Primary Examiner* — Brittany Raymond

(57) ABSTRACT

An exposure method for exposing a bright-dark pattern onto each exposure region of a substrate via a projection optical system includes a position detection process for detecting positions of a plurality of microscopic regions in a unit exposure field of the substrate, a deformation calculation step of calculating a state of deformation in the unit exposure field based on information related to the positions of the plurality of microscopic regions obtained in the position detection step, and a shape modification step of modifying the shape of the bright-dark pattern to be exposed on the substrate based on the deformation state obtained in the deformation calculation step. The microscopic regions detected in the position detection step include a circuit pattern formed in the unit exposure field.

32 Claims, 14 Drawing Sheets

EXPOSURE METHOD AND ELECTRONIC DEVICE MANUFACTURING METHOD

CROSS-REFERENCE TO RELATED APPLICATIONS

This application claims the benefit of U.S. Provisional Patent Application No. 60/924,711, filed on May 29, 2007.

BACKGROUND OF THE INVENTION

An embodiment of the present invention relates to an exposure method and an electronic device manufacturing method. More particularly, the embodiment of the present invention relates to an exposure method used in a lithography process for manufacturing electronic devices such as semiconductor devices, imaging devices, liquid crystal display devices, and thin-film magnetic heads.

A plurality of layers of circuit patterns are formed on a wafer (or a substrate such as a glass plate), which is coated with a photosensitive material, in processes for manufacturing electronic devices such as semiconductor devices. An exposure apparatus is required to align a mask, on which a transferred pattern is formed, and the wafer, on which a circuit pattern has been formed. The exposure apparatus includes an alignment unit for such alignment, which may be, for example, an imaging type alignment unit.

The imaging-device-based alignment unit illuminates a position detection mark (wafer alignment mark) formed on the wafer with light having a wide wavelength band and emitted from a light source such as a halogen lamp. The alignment unit then forms a magnified image of the wafer alignment mark on an imaging device with an imaging optical system and performs image processing on an obtained imaging signal to detect the position of the wafer mark.

A plurality of unit exposure fields are defined on a single wafer in a manner that the unit exposure fields are arranged in a matrix. A circuit pattern or the like corresponding to a functional element, such as a large-scale integrated (LSI) circuit, is formed in each unit exposure field through a single exposure operation (e.g., a one-shot exposure operation or a scanning exposure operation). More specifically, the exposure apparatus repeatedly performs an exposure operation for a single unit exposure field a number of times while step-moving the wafer with respect to a projection optical system. As a result, one or more alignment marks are transferred into each unit exposure field together with one or more LSI circuit patterns.

A conventional position detection apparatus includes a single position detection mechanism (e.g., an alignment microscope) or an X position detection mechanism and a Y position detection mechanism. The wafer on which patterns have been exposed may be deformed in an in-plane direction during wafer processing, which includes etching and film formation. More specifically, the wafer may expand or contract entirely or locally from its original shape due to the wafer processing or the like.

To cope with such deformation of a wafer onto which patterns have been exposed, enhanced global alignment (EGA) has been proposed to correct in-plane deformation of the wafer associated with the arrangement of unit exposure fields. To cope with linear deformation of each unit exposure field, or more specifically, expansion, contraction, and rotation of each unit exposure field, which is expressed by a linear function using orthogonal coordinates representing an in-plane position of each unit exposure field or X and Y coordinates, a magnification correction method for correcting the magnification of the projection optical system and a mask rotation method for rotating the mask have been proposed.

In conventional art, special marks that differ from circuit patterns have been used as position detection marks (also referred to as wafer alignment marks) for alignment purposes. To form the special marks on the wafer, the special marks are transferred onto the unit exposure fields together with circuit patterns. Wafer alignment marks are also formed in a peripheral portion of each unit exposure field (an inner portion extending along a contour boundary of each unit exposure field) so that the LSI design freedom is virtually unaffected by the alignment marks. In addition to the peripheral portion of a unit exposure field or instead of a peripheral portion of a unit exposure field, alignment marks may be formed in a single unit exposure field between two adjacent LSI circuit patterns in a region referred to as a street line when a plurality of LSI circuit patterns are formed in a single unit exposure field.

BRIEF SUMMARY OF THE INVENTION

In recent years, LSI circuit patterns have been further miniaturized. As a result, patterns are required to be superimposed over one another on the substrate with higher accuracy. Accordingly, in the future, an exposure apparatus will have to cope with nonlinear deformation occurring in the unit exposure fields, whereas such deformations were not subject to consideration in conventional art. A "nonlinear deformation" refers to high-order deformation that cannot be expressed by a linear function using X and Y coordinates.

To measure such nonlinear deformation in a unit exposure field, for example, the positions of many marks discretely formed in a unit exposure field must be detected.

The number of LSI circuit patterns in each unit exposure field depends on the type of LSI circuits but is twelve at most. For example, when a total of twelve LSI circuit patterns are arranged in three lines in the X-direction and four lines in the Y-direction, in conventional art, position detection marks are formed at four discrete positions in the X-direction and five discrete positions in Y-direction. In this case, the distribution of the position detection marks is too rough. Thus, it is difficult to measure deformation occurring in the unit exposure field, especially, deformation occurring in the LSI circuit patterns with high accuracy.

It is an object of the embodiment according to the present invention to provide an exposure method enabling rapid and accurate measurement of nonlinear deformation occurring in a unit exposure field and enabling the superimposition of patterns on a substrate with high accuracy.

A first aspect of the present invention provides an exposure method for exposing a bright-dark pattern onto unit exposure fields of a substrate via a projection optical system. The method includes a position detection step of detecting positions of a plurality of microscopic regions in one of the unit exposure fields of the substrate relative to an in-plane-direction, a deformation calculation step of calculating a state of deformation in the unit exposure field based on information related to the positions of the plurality of microscopic regions obtained in the position detection step, and a shape modification step of modifying the shape of the bright-dark pattern to be exposed on the substrate based on the deformation state obtained in the deformation calculation step. At least one of the plurality of microscopic regions detected in the position detection step includes a circuit pattern formed in the one of the unit exposure fields.

Hereinafter, the "unit exposure field" refers to a unit exposure field defined as a unit on the substrate, in which a bright-dark pattern is formed through a single exposure operation (e.g., a one-shot exposure operation or a scanning exposure operation). The "circuit pattern" is a pattern that forms at least part of an electric circuit that has been formed or is being formed on a substrate and refers to a pattern that is formed through a single lithography process or a plurality of lithography processes.

A second aspect of the present invention provides a method for manufacturing an electronic device and includes a lithography process. In the lithography process, the exposure method of the first aspect is used.

In the exposure method of the embodiment according to the present invention, substrate-in-plane-direction positions of a plurality of microscopic regions including existing circuit pattern formed in a unit exposure field of a wafer are detected. Based on information on the positions of the plurality of microscopic regions that function as position detection marks, the state of deformation in the unit exposure field is calculated. In other words, nonlinear deformation of the existing pattern that has been formed in the unit exposure field is measured based on the information on the plurality of positions in the unit exposure field.

In the embodiment according to the present invention, the superimposition accuracy of patterns on the substrate is improved by modifying the shape of a bright-dark pattern to be exposed on the substrate in correspondence with the deformation of an existing pattern that has been formed in the unit exposure field. The exposure method of the embodiment according to the present invention enables nonlinear deformation occurring in the unit exposure field to be measured with accuracy by detecting a plurality of microscopic regions arranged at narrow intervals. This enables the superimposition of patterns to on a substrate with high accuracy. As a result, the exposure method of the embodiment according to the present invention enables the manufacturing of an electronic device with high accuracy.

BRIEF DESCRIPTION OF THE SEVERAL VIEWS OF THE DRAWING

A general architecture that implements the various features of the invention will now be described with reference to the drawings. The drawings and the associated descriptions are provided to illustrate embodiments of the invention and not to limit the scope of the invention.

DETAILED DESCRIPTION OF THE INVENTION

Figure 1:
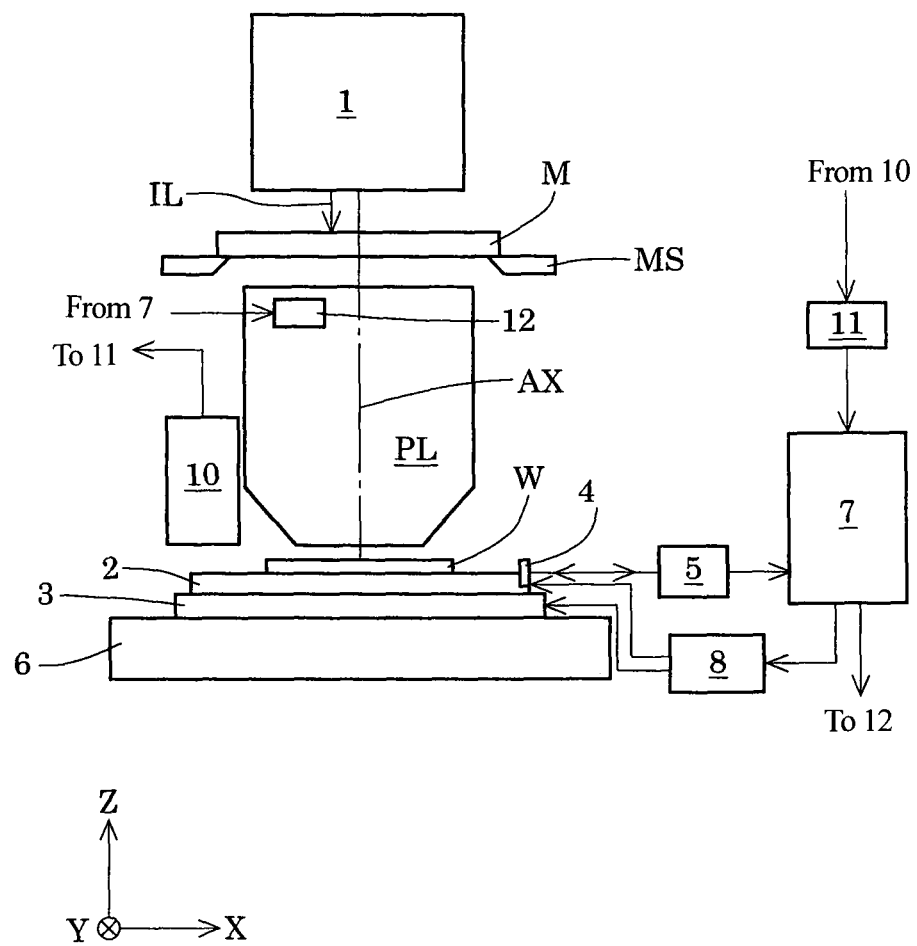
FIG. 1 is a schematic diagram showing an exposure apparatus used to perform an exposure method according to an embodiment of the present invention.

An embodiment of the present invention will now be described with reference to the drawings. FIG. 1 is a schematic diagram showing the structure of an exposure apparatus used when performing an exposure method according to the embodiment of the present invention. In FIG. 1, X-axis and Y-axis are orthogonal to each other within a plane parallel to a surface (exposure surface) of a wafer W, whereas the Z-axis extends in a direction normal to the surface of the wafer W. More specifically, the XY plane extends horizontally and the (+)Z-axis extends upward in the vertical direction.

The exposure apparatus shown in FIG. 1 includes an exposure light source, such as an ArF excimer laser, and an illumination unit 1, which includes an optical integrator (homogenizer), a field stop, and a condenser lens. The illumination unit 1 illuminates a mask (reticle) M, on which a pattern that is to be transferred is formed, with exposure light IL, which is emitted from the light source. If the exposure apparatus of the present embodiment employs a step-and-repeat method, the illumination unit 1 illuminates, for example, the entire rectangular pattern field of the mask M. If the exposure apparatus of the present embodiment employs a step-and-scan, the illumination unit 1 illuminates an elongated slit-shaped region (e.g., rectangular region) extending in the entire pattern field in the X-direction, which is orthogonal to the Y-direction and which is the scanning direction.

Light from the pattern of the mask M is made incident on a projection optical system PL, which has a predetermined reduction magnification. The projection optical system PL forms a pattern image (bright-dark pattern) of the mask M in each unit exposure field defined on the wafer W, which is coated with photoresist. The wafer W is one example of a substrate. More specifically, in optical correspondence with the illumination region (a field of view) on the mask M, the projection optical system PL forms a mask pattern image in a rectangular region that is similar to the entire pattern field of the mask M in each unit exposure field of the wafer W or in an elongated rectangular region of the unit exposure field of the wafer W (stationary exposure field) extending in the X-direction.

A mask stage MS supports the mask M in a manner that the mask M is parallel to the XY plane. The mask stage MS incorporates a mechanism for slightly moving the mask M in the X-direction, Y-direction, and a rotation direction about Z-axis. The mask stage MS includes a movable mirror (not shown). The X position, Y position, and rotation position of the mask stage MS (and the mask M) are measured in real time by a mask laser interferometer (not shown) that uses the movable mirror.

A wafer holder (not shown) supports the wafer W on a Z-stage 2 in a manner that the wafer W is parallel to the XY plane. The Z-stage 2 is fixed to an XY-stage 3. The XY-stage 3 moves along the XY plane, which is substantially parallel to an image plane of the projection optical system PL. The Z-stage 2 adjusts the focal position (Z-direction position) and the tilt angle of the wafer W (the tilt of the surface of the wafer W with respect to the XY plane). The Z-stage 2 includes a movable mirror 4. The X position, Y position, and rotation position about the Z-axis of the Z-stage 2 are measured in real time by a wafer laser interferometer 5 that uses the movable mirror 4. The XY-stage 3 is mounted on a base 6. The XY-stage 3 adjusts the X position, Y position, and rotation position of the wafer W.

An output of the mask laser interferometer and an output of the wafer laser interferometer 5 are provided to a main control system 7. The main control system 7 controls the X position, Y position, and rotation position of the mask M based on the values measured by the mask laser interferometer. More specifically, the main control system 7 transmits a control signal to the mechanism incorporated in the mask stage MS. The mechanism adjusts the X position, Y position, and rotation position of the mask M by finely moving the mask stage MS based on the control signal.

The main control system 7 controls the facal position and the tilt angle of the wafer W so that the surface of the wafer W is positioned to coincide with the image plane of the projection optical system PL through autofocusing and automatic leveling. More specifically, the main control system 7 transmits a control signal to a wafer stage drive system 8. The wafer stage drive system 8 drives the Z-stage 2 based on the control signal to adjust the facal position and the tilt angle of the wafer W.

The main control system 7 further controls the X position, Y position, and rotation position of the wafer W based on the values measured by the wafer laser interferometer 5. More specifically, the main control system 7 transmits a control signal to the wafer stage drive system 8. The wafer stage drive system 8 adjusts the X position, Y position, and rotation position of the wafer W by driving the XY stage 3 based on the control signal.

When a step-and-repeat system is performed, the pattern image of the mask M is one-shot exposed onto one of a plurality of unit exposure fields, which are arranged in a matrix on the wafer W. Afterwards, the main control system 7 transmits a control signal to the wafer stage drive system 8 and step-moves the XY-stage 3 along the XY plane using the wafer stage drive system 8 to align another unit exposure field of the wafer W with the projection optical system PL. In this manner, the one-shot exposure of the pattern image of the mask M onto a unit exposure field of the wafer W is repeated.

In the step-and-scan system, the main control system 7 transmits a control signal to the mechanism incorporated in the mask stage MS and a control signal to the wafer stage drive system 8. This scans and exposes a pattern image of the mask M onto a single unit exposure field on the wafer W while the mask stage MS and the XY stage 3 are being moved at a velocity ratio determined in accordance with the projection magnification of the projection optical system PL. Afterwards, the main control system 7 transmits a control signal to the wafer stage drive system 8 and step-moves the XY-stage 3 along the XY plane using the wafer stage drive system 8 to align another unit exposure field of the wafer W with the projection optical system PL. The scanning exposure operation of the pattern image of the mask M onto unit exposure fields of the wafer W is repeated in this manner.

More specifically, with the step-and-scan system, the mask stage MS and the XY-stage 3, and consequently the mask M and the wafer W, are moved (scanned) in synchronization with each other in the Y-direction that is the short side direction of the rectangular (normally slit-shaped) stationary exposure field while the positions of the mask M and the wafer W are controlled by the wafer stage drive system 8, the wafer laser interferometer 5, and the like. As a result, the mask pattern is scanned and exposed onto a region on the wafer W that has a width equal to the long side of the stationary exposure field and a length corresponding to a scanning amount (movement amount) of the wafer W.

To measure nonlinear deformation occurring in each unit exposure field of the wafer W and improve the accuracy for superimposing patterns formed on the wafer W, the exposure apparatus shown in FIG. 1 includes a position detection system 10, a deformation calculation unit 11, and an optical surface shape modification unit 12. The position detection system 10 detects the positions of a plurality of microscopic regions in each unit exposure field of the wafer W without using the projection optical system PL. The deformation calculation unit 11 calculates the state of deformation occurring in each unit exposure field of the wafer W based on the detection result of the position detection system 10. To correct the shape of a pattern image (bright-dark pattern) exposed onto the wafer W, the optical surface shape modification unit 12 modifies the shape of at least one optical surface of the projection optical system PL based on the calculation result of the deformation calculation unit 11.

Figure 2:
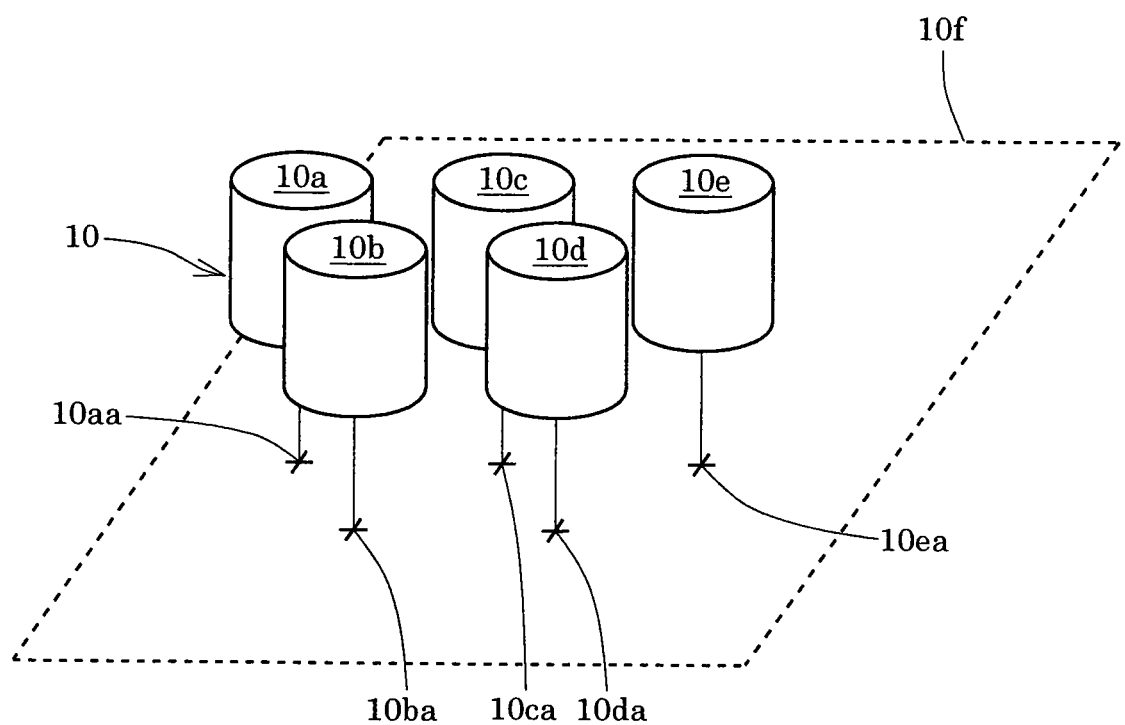
FIG. 2 is a schematic diagram showing the interior of a position detection system shown in FIG. 1.

As shown in FIG. 2, the position detection system 10 includes a plurality of position detection mechanisms that are arranged two-dimensionally along the XY plane. To simplify the drawing, FIG. 2 shows only five position detection mechanisms 10a, 10b, 10c, 10d, and 10e among the plurality of position detection mechanisms that form the position detection system 10. The position detection mechanisms 10a, 10b, 10c, 10d, and 10e are in a zigzag arrangement. The zigzag arrangement refers to an arrangement in which position detection mechanisms are alternately arranged toward the +Y direction and a −Y direction from a straight line extending in the X-direction. FIG. 2 shows two adjacent lines, namely, a first line including the position detection mechanisms 10a, 10c, and 10e and a second line including the position detection mechanisms 10b and 10d. The position detection mechanisms 10a, 10c, and 10e are offset in the +Y direction and arranged at predetermined intervals in the first line. The position detection mechanisms 10b and 10d are offset in the −Y direction and arranged at predetermined intervals in the second line. Reference detection positions 10aa to 10ea of the five position detection mechanisms 10a to 10e fall within a rectangular range 10f, which is substantially equal to one unit exposure field of the wafer W. In FIG. 2, the reference detection position of each of the position detection mechanisms 10a to 10e, which is indicated by a crossed mark, is the center of the detection region of each position detection mechanism. In the embodiment, the reference detection positions of the position detection mechanism forming the position detection system 10 all fall within the range 10f.

Figure 3:
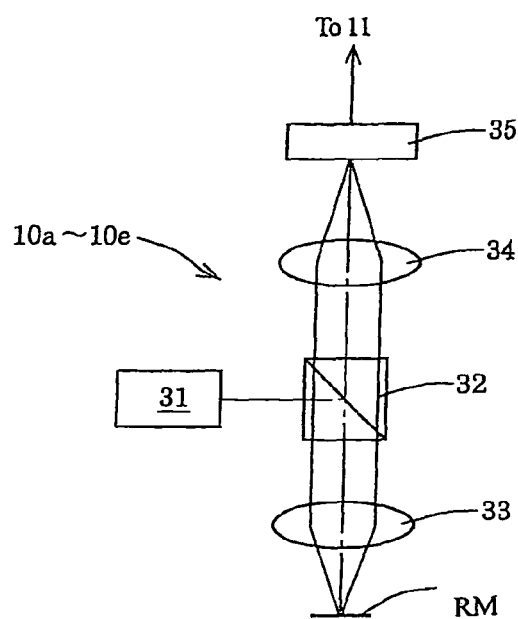
FIG. 3 is a schematic diagram showing the interior of each position detection mechanism in the position detection system shown in FIG. 1.

The position detection mechanisms 10a to 10e may be, for example, optical imaging-device based position detection mechanisms. The position detection mechanisms 10a to 10e each have the same basic structure. In each of the imaging-device-based position detection mechanisms 10a to 10e, as shown in FIG. 3, illumination light emitted from an illumination unit 31 is reflected by a half prism 32, passes through a first objective lens 33, and illuminates a microscopic region RM in the unit exposure field of the wafer W. The microscopic region RM, which functions as a position detection mark, is not formed separately from a pattern formed in the unit exposure field and includes a circuit pattern formed in the unit exposure field. The microscopic region RM will be described in detail later. The illumination unit 31 may be arranged so that one is provided for each position detection mechanisms or so that the position detection mechanisms commonly use the same one.

Reflection light (including diffraction light) of the illumination light from the microscopic region RM passes through a first objective lens 33, the half prism 32, and a second objective lens 34 to form an image of the microscopic region RM on an imaging plane of an imaging device 35 such as a CCD camera. The imaging device 35 is one example of a detection unit. More specifically, the CCD camera 35 functions as a photoelectric detector (light detection unit) for photoelectrically detecting the image of the microscopic region RM, which is formed through an imaging optical system that includes the first objective lens 33 and the second objective lens 34. The first objective lens 33, the half prism 32, and the second objective lens 34 form an example of a detection lens barrel. The imaging device 35 is an example of a detection unit.

The CCD camera 35 processes a photoelectric detection signal (processes the waveform of the signal) based on the detected image of the microscopic region RM with an internal signal processing unit (not shown). Through such processing, the CCD camera 35 obtains, for example, the X and Y coordinates representing the central position of the microscopic region RM as position information on the microscopic region RM. The CCD camera 35 provides the deformation calculation unit 11 with the position information on the microscopic region RM as the output of the position detection mechanisms 10a to 10e (or the output of the position detection system 10).

The deformation calculation unit 11 calculates the state of deformation occurring in the unit exposure field based the detection result of the position detection system 10, that is, the position information (a plurality of position detection values) of the plurality of microscopic regions RM formed in the unit exposure field of the wafer W. More specifically, the deformation calculation unit 11 detects a positional deviation amount of each microscopic region RM in the unit exposure field of the wafer W from the corresponding reference position. Based on information on the positional deviation amount of each microscopic region RM, the deformation calculation unit 11 approximates deformation occurring in the unit exposure field with, for example, a nonlinear function defined using X and Y coordinates.

It is assumed here that high-level deformation that occurs in the unit exposure field is expressed by a high-order function using X and Y coordinates. The coordinates indicating the designed position of the microscopic region RM (hereafter referred to as "design value") is represented by (Dxn, Dyn). The coordinates indicating the actually detected position of the microscopic region RM (hereafter referred to as "measurement value") is represented by (Fxn, Fyn). Variable factors a to f (primary variable elements) and variable factors g to j (high-order variable elements) indicate causes of the positional deviation between the design value and the measurement value. In this case, relationship between the actual measurement value and the design value is represented by formula (1), which is shown below. In the formula (1), n is an integer indicating the number given to each microscopic region RM formed in the unit exposure field.

$$\begin{bmatrix} Fxn \\ Fyn \end{bmatrix} = \begin{bmatrix} a & b \\ c & d \end{bmatrix}\begin{bmatrix} Dxn \\ Dyn \end{bmatrix} + \begin{bmatrix} e \\ f \end{bmatrix} + \begin{bmatrix} g\,Dxn^2 \\ h\,Dyn^2 \end{bmatrix} + \begin{bmatrix} i\,Dxn^3 \\ j\,Dyn^3 \end{bmatrix} \quad (1)$$

However, a positional deviation amount, or a residual error term (Exn, Eyn), exists between the design value (Dxn, Dyn) and the actual measurement value (Fxn, Fyn). The relationship of the measurement value and the design value taking into consideration the residual error term is represented by formula (2).

$$\begin{bmatrix} Fxn \\ Fyn \end{bmatrix} = \begin{bmatrix} a & b \\ c & d \end{bmatrix}\begin{bmatrix} Dxn \\ Dyn \end{bmatrix} + \begin{bmatrix} e \\ f \end{bmatrix} + \begin{bmatrix} g\,Dxn^2 \\ h\,Dyn^2 \end{bmatrix} + \begin{bmatrix} i\,Dxn^3 \\ j\,Dyn^3 \end{bmatrix} + \begin{bmatrix} Exn \\ Eyn \end{bmatrix} \quad (2)$$

The x-element in formula (2) can be expressed as formula (3).

$$Exn = Fxn - (aDxn + bDyn + e + gDxn^2 + iDxn^3) \quad (3)$$

In the same manner, the y-element in formula (2) can be expressed as formula (4).

$$Eyn = Fyn - (cDxn + dDyn + f + hDyn^2 + jDyn^3) \quad (4)$$

Each variable element is determined to minimize the square sum of the residual error term with, for example, a least-squares method. In this manner, the deformation occurring in the unit exposure field can be approximated using the high-order function.

The approximation with the high-order function described above uses second-order and third-order elements as the high-order elements. However, the approximation may also use fourth or higher-order elements. The deformation occurring in the unit exposure field may also be approximated with a function system represented in polar coordinates. In this case, wavefront aberration of the optical system can be expressed using series expansions such as the Zernike expansion.

The reference position of each microscopic region RM is either its designed position or its actual position measured immediately after the microscopic region RM is formed and before wafer processing. Approximating nonlinear deformation occurring in the unit exposure field of the wafer W with a function using the deformation calculation unit 11 is equivalent to approximating nonlinear deformation occurring in the existing circuit pattern formed in the unit exposure field of the wafer W with a function.

Figure 4:
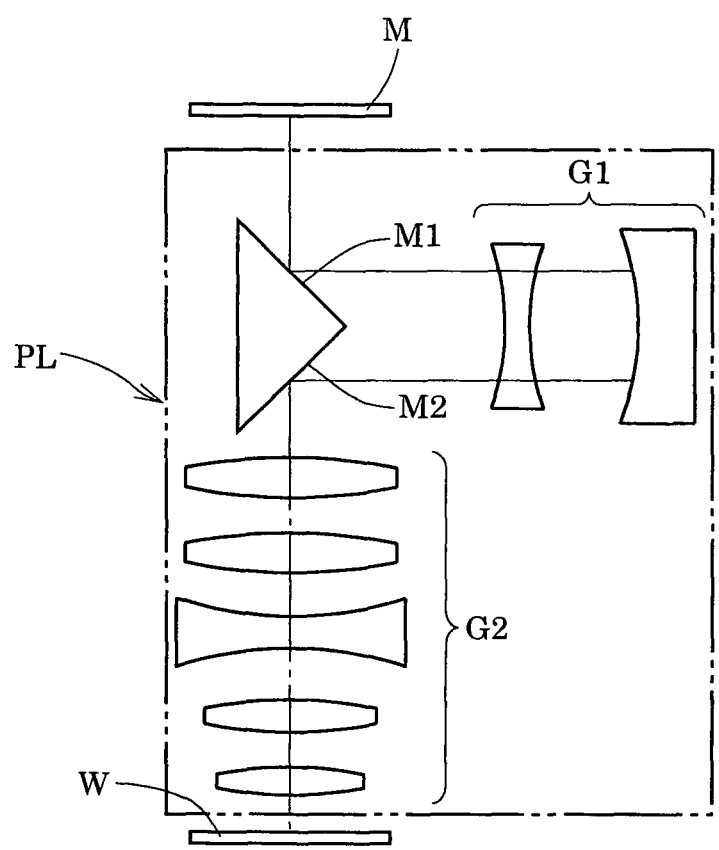
FIG. 4 is a schematic diagram showing a two-time imaging catadioptric projection optical system as one example of the projection optical system shown in FIG. 1.

The optical surface shape modification unit 12 functions to modify the aberration of the projection optical system PL by modifying the shape of at least one optical surface of the projection optical system PL. Hereafter, a two-time imaging catadioptric projection optical system PL shown in FIG. 4 will be used as an example to describe the detailed structure of the optical surface shape modification unit 12. The projection optical system PL in FIG. 4 includes a catadioptric first imaging optical system G1 and a dioptric second imaging optical system G2. The first imaging optical system G1 forms an intermediate image of the pattern of the mask M. The second imaging optical system G2 forms a final reduced image of the mask pattern on the wafer W based on light from the intermediate image.

Figure 5:
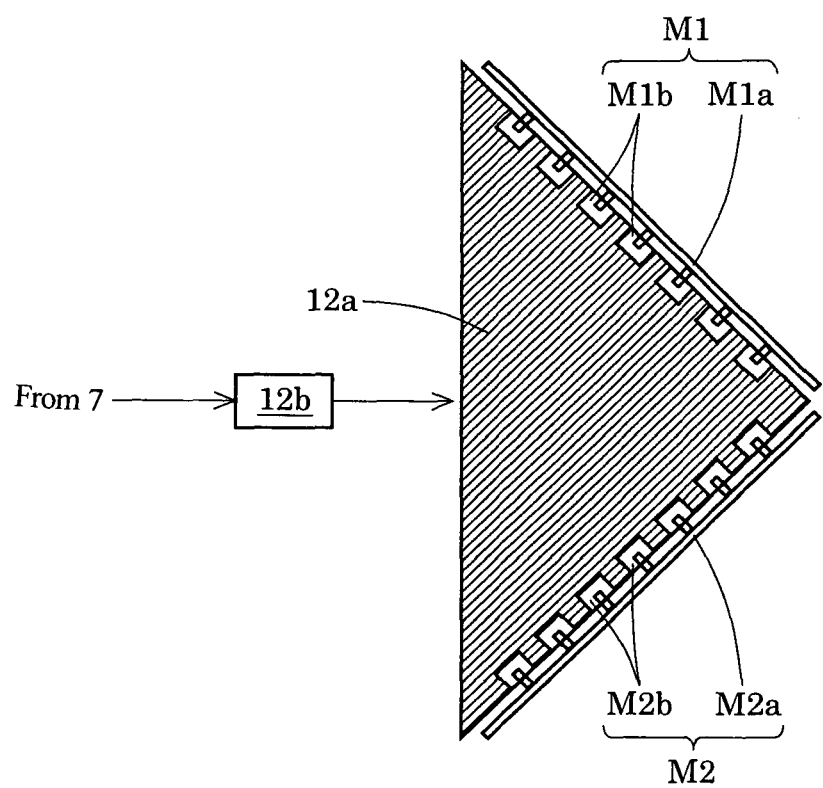
FIG. 5 is a schematic diagram showing the interior of an optical surface shape modification unit shown in FIG. 1.

A plane mirror M1, which may be a deformable mirror, is arranged on an optical path from the mask M to the first imaging optical system G1. A plane mirror M2, which is formed by a deformable mirror, is also formed on an optical path from the first imaging optical system G1 to the second imaging optical system G2. A reflection surface of the plane mirror M1 is positioned near to the mask M. A reflection surface of the plane mirror M2 is arranged at an intermediate image formation position or positioned near the intermediate image formation position. As shown in FIG. 5, the plane mirror M1 includes, for example, a reflection member M1a having a reflection surface and a plurality of drive elements M1b arranged next to each other in a two-dimensional manner in correspondence with the reflection surface of the reflection member M1a. In the same manner, the plane mirror M2 includes a reflection member M2a having a reflection surface and a plurality of drive elements M2b arranged next to each other in a two-dimensional manner in correspondence with the reflection surface of the reflection member M2a.

In addition to the plane mirrors M1 and M2, the optical surface shape modification unit 12 includes a mirror substrate 12a, which is shared by the plane mirrors M1 and M2, and a drive unit 12b, which independently drives the plurality of drive elements M1b and M2b. The drive unit 12b independently drives the drive elements M1b and M2b based on a control signal provided from the main control system 7, which has received the output of the deformation calculation unit 11. The drive elements M1b and M2b are attached to the common mirror substrate 12a. The drive elements M1b and M2b modify the shapes of the reflection surfaces of the reflection member M1a and M2b to a desired shape through independent push-and-pull operations.

In this manner, the optical surface shape modification unit 12 modifies the shape of at least either one of 0the reflection surface of the plane mirror M1, which is arranged near an object plane of the projection optical system PL, and the reflection surface of the plane mirror M2, which is arranged at a position optically conjugate to the object plane of the projection optical system PL or near the conjugate position. This modifies the aberration state of the projection optical system PL and actively generates distortion of the projection optical system PL. As a result, the optical surface shape modification unit 12 modifies the shape of the mask pattern image (bright-dark pattern) exposed onto the unit exposure field of the wafer W. The shape of the bright-dark pattern refers to deformation of the entire bright-dark pattern in the unit exposure field, that is, distortion of the bright-dark pattern in the unit exposure field.

Figure 6:
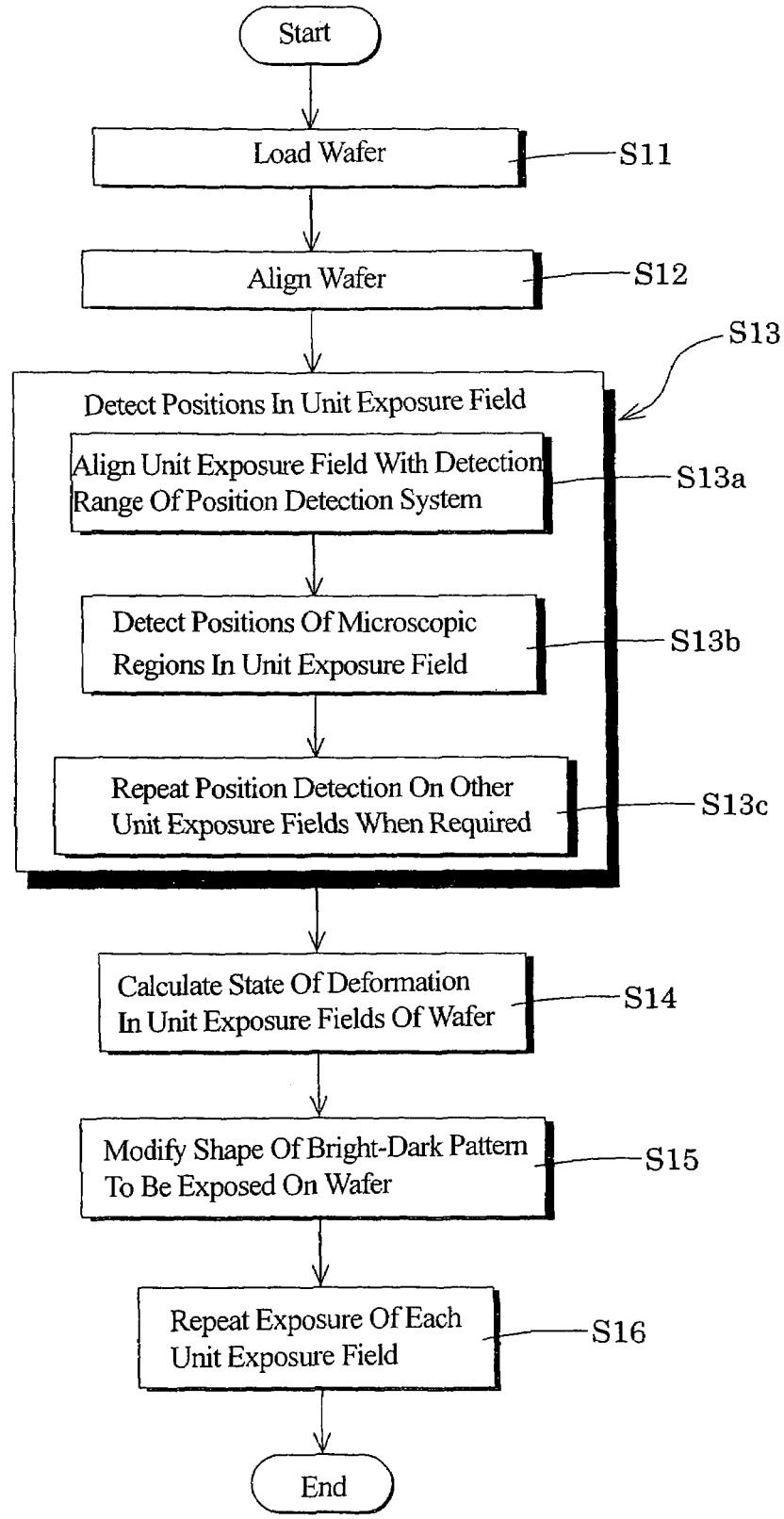
FIG. 6 is a flowchart illustrating an exposure sequence of the exposure method according to an embodiment of the present invention.

FIG. 6 is a flowchart schematically showing an exposure sequence of the exposure method according to an embodiment of the present invention. To facilitate understanding of the present invention, it will hereafter be assumed that the exposure method of the present embodiment is used for one-shot exposure of the pattern of the mask M onto each unit exposure field of the wafer W with the use of the exposure apparatus of FIG. 1. Referring to FIG. 6, in the exposure method of the present embodiment, a wafer W, which has one or more circuit patterns exposed thereon and which has been subjected to wafer processing, is loaded onto the Z-stage 2 (S11).

Figure 7:
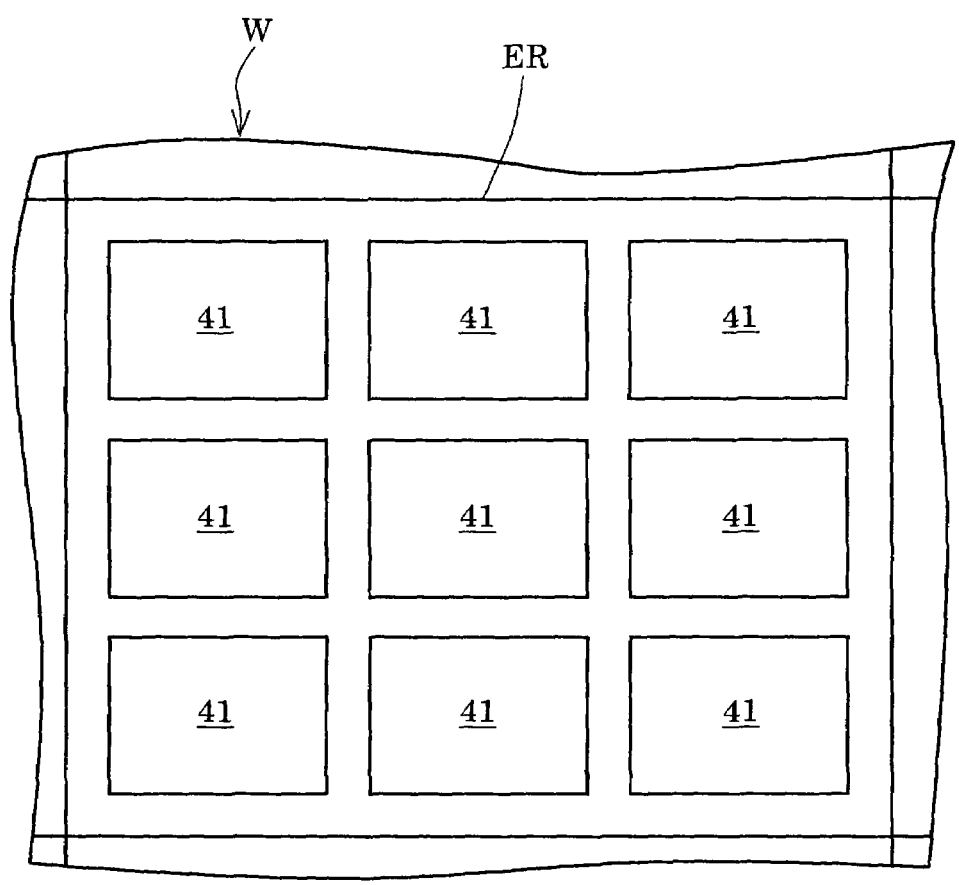
FIG. 7 is a schematic diagram showing a plurality of LSI circuit patterns that are formed in a unit exposure field of a wafer.

As shown in FIG. 7, a total of, for example, nine circuit patterns 41, which are functional devices such as LSI circuits, are arranged in three lines in the X-direction and three lines in the Y-direction in each unit exposure field of the wafer W that is loaded on the Z-stage 2 in the loading process in performed in step S11. The functional element is a minimum unit that functions as a single independent electronic device, that is, a single chip. The wafer W is then aligned relative to the projection optical system PL (and the mask M) (S12). In the alignment process performed in step S12, the XY-stage 3 is driven as required based on, for example, information on the outer shape of the wafer W. This pre-aligns (roughly aligns) the wafer W relative to the projection optical system PL.

In the alignment process S12, the positions of a plurality of wafer alignment marks formed on the wafer W are detected using, for example, the position detection system 10 shown in FIG. 1, and the XY-stage 3 is driven as required based on the position information. This finely aligns (precisely aligns) the wafer W relative to the projection optical system PL. Through the alignment process S12, the projection optical system PL optically aligns the mask M on which a transferred pattern is formed and the wafer W on which the circuit patterns have been formed, and consequently the pattern field on the mask M and the unit exposure field on the wafer W.

Figure 8:
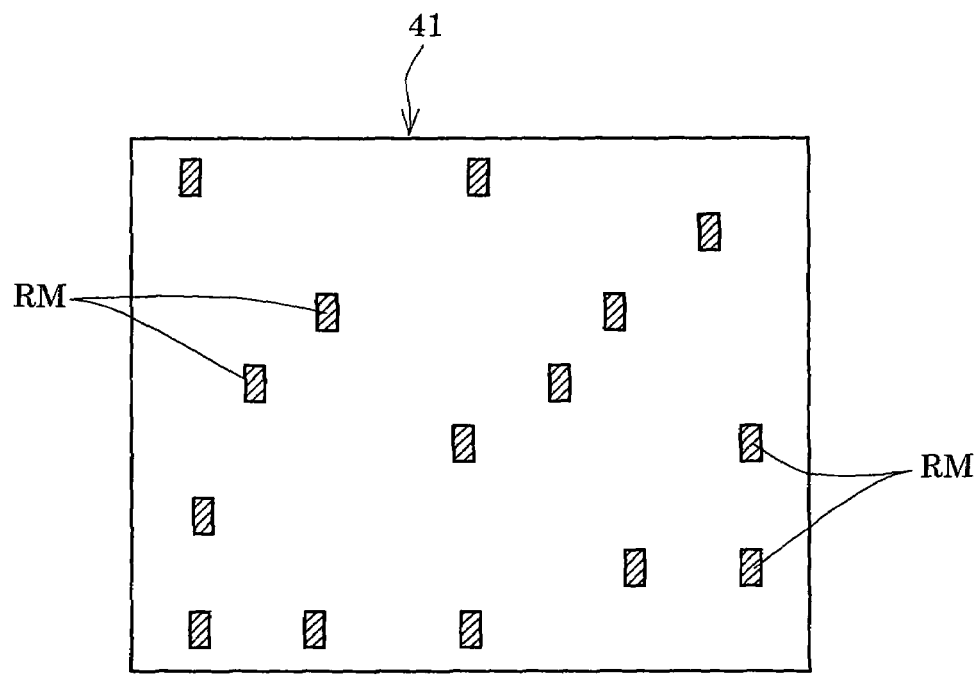
FIG. 8 is a schematic diagram showing a plurality of microscopic regions dispersed in a unit exposure field.

Then, in the exposure method of the present embodiment, the positions of the plurality of microscopic regions RM in the in-plane direction of a wafer are detected in at least one unit exposure field ER of the wafer W (S13). The microscopic regions RM detected in the position detection process S13 include parts of the existing circuit patterns formed in the unit exposure field ER, or more specifically, parts of the LSI circuit patterns 41. As shown in FIG. 8, the microscopic regions RM in the unit exposure field ER are arranged in a predetermined distribution within the range of each of the LSI circuit patterns 41.

The predetermined distribution refers to, for example, the substantially uniform distribution of microscopic regions RM in a circuit pattern 41. The predetermined distribution may also refer to the distribution of many microscopic regions RM in a peripheral portion of a circuit pattern 41. A substantially uniform distribution may be obtained by equally dividing a circuit pattern 41 into a plurality of parts in the X-direction and the Y-direction and arranging (or selecting) a single microscopic region RM in each of the divided parts.

Instead of the equal division, many microscopic regions RM may be distributed in the peripheral portion of a circuit pattern 4 by, for example, dividing a circuit pattern 41 into a plurality of parts in the X-direction and Y-direction so that parts closer to the center of the circuit pattern 41 have a greater width than parts closer to the periphery of the circuit pattern 41. In FIG. 8, the size of each microscopic region RM, which is selected as a position detection mark, is exaggerated with respect to the entire size of each LSI circuit pattern 41 for the sake of brevity.

It is preferred that the position detection accuracy, in particular, the accuracy for detecting high-order deformation occurring in a unit exposure field be higher as the number of microscopic regions RM functioning as position detection marks increases. However, the detection time would take much time when there are too many microscopic regions RM. This will lower the processing capacity (throughput) of the exposure apparatus. To achieve a high throughput and a high detection accuracy, it is preferable that at least four microscopic regions RM be used for the position detection. With only three or less microscopic regions RM, deformation occurring in the unit exposure field or in particular high-order deformation may result in insufficient accuracy.

The LSI circuit patterns 41 typically include many periodic patterns, such as line-and-space patterns. A line-and-space pattern is formed by alternately arranging predetermined line patterns (line portions) and space patterns (space portions), of which brightness differs from the line patterns. Accordingly, a relatively wide rectangular line portion or a relatively wide rectangular space portion may be used as a microscopic region RM in a periodic pattern as in a line-and-space pattern. In this case, it is preferred that the width (short-side dimension) of the line portion or the space portion selected as the microscopic region RM be at least a value equivalent to the resolution of the employed position detection mechanisms (position detection system). When the employed imaging-device-based alignment system (position detection system) has a numerical aperture of about 0.3 and a usable wavelength of about 500 nm, the width of the line portion or the space portion is preferably at least 0.8 µm. In other words, a microscopic region that substantially differs in brightness from its adjacent region on the wafer (adjacent region in a broad concept meaning that an adjacent region does not necessarily have to be in contact with the microscopic region) may be used as a position detection mark. Brightness refers to the state of intensity distribution of an image formed by imaging the region or its surrounding region, which is measured using for example an optical microscope having a detection wavelength in a range of about 400 to 800 nm. Alternatively, when laser light having a wavelength of about 400 to 800 nm is emitted, brightness may refer to the intensity distribution of reflection light that differs in accordance with the reflectivity of the illuminated region and its surrounding region.

Multiple layers of thin-film patterns are normally formed on the wafer W through earlier exposure processes. For example, FIG. 8 shows the shape of a circuit pattern with the microscopic regions RM in a predetermined one of the multiple thin-film patterns of the wafer W. More specifically, the shape of a thin-film pattern formed in the immediately preceding exposure process may be used for the position detection. Alternatively, among the existing thin-film patterns formed on the wafer W, the shape of a thin-film pattern formed from a material that produces the highest contrast may be used for the position detection.

Figure 9:
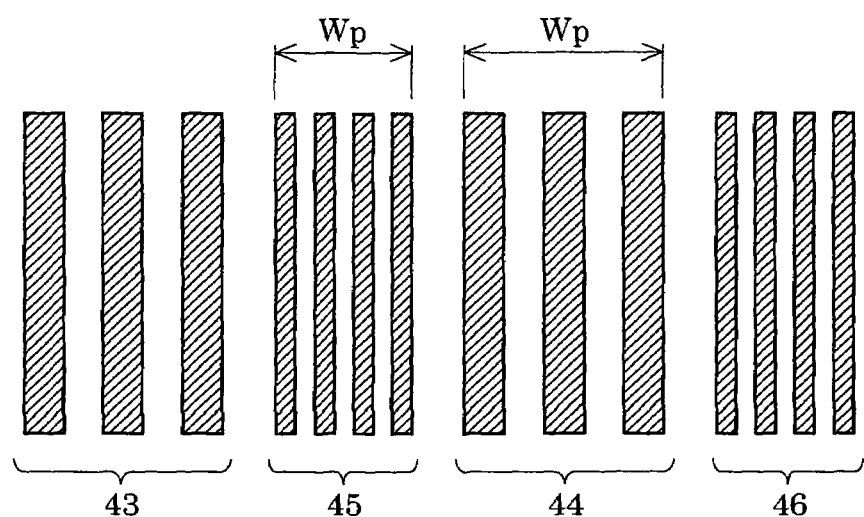
FIG. 9 is a schematic diagram showing the selection of a line-and-space patterns functioning as microscopic regions.

Depending on the LSI type, the circuit pattern 41 may include rough line-and-space patterns 43 and 44 that have relatively large pitches and are arranged alternately with line-and-space patterns 45 and 46 having relatively small pitches, as shown in FIG. 9. In this case, for example, the line-and-space pattern 45, which is arranged between the rough line-and-space patterns 43 and 44, may be used as a microscopic region RM. Alternatively, the rough line-and-space pattern 44, which is arranged between the dense line-and-space patterns 45 and 46, may be used as a microscopic region RM. It is preferable that the width dimension (pitch-direction dimension) Wp of the dense line-and-space pattern 45 or the rough line-and-space pattern 44, which is selected as the microscopic region RM, be greater than or equal to the resolution of the employed position detection system. The line-and-space pattern 45 shown in FIG. 9 may include at least one line portion of which width dimension (pitch-direction dimension) is smaller than or equal to the resolution of the employed position detection system. In this case, the line portion of which width is smaller than or equal to the value equivalent to the resolution of the position detection system changes the density of a detected circuit pattern. In this manner, the line-and-space pattern 45 including the line portion of which width is smaller than or equal to the resolution of the position detection system may also be used as a microscopic region RM.

Figure 10:
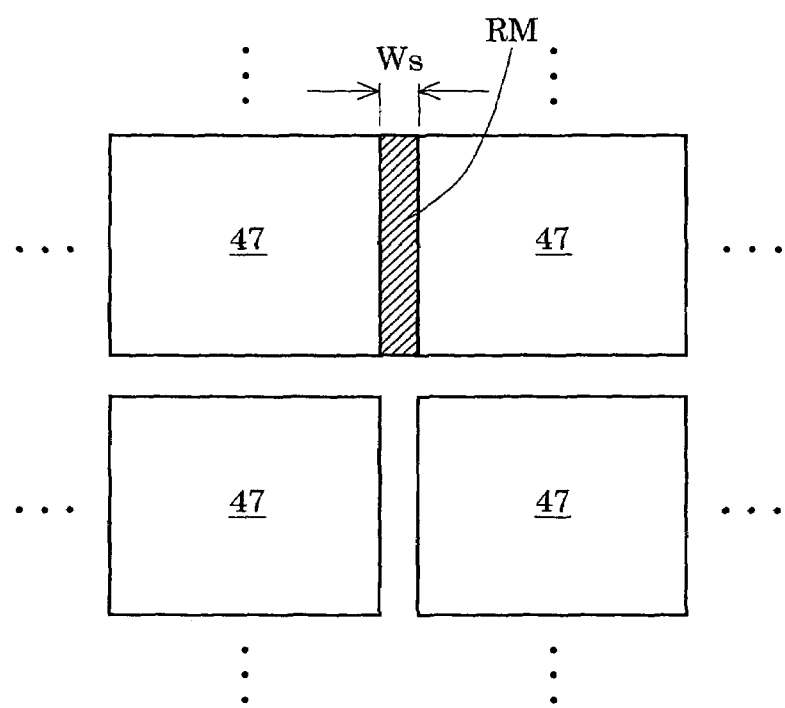
FIG. 10 is a schematic diagram showing the selection of a marginal area functioning as a microscopic region between memory cell groups.

As shown in FIG. 10, for an SRAM or DRAM, the LSI circuit pattern 41 may include many memory cell groups (e.g., 128 by 128 cells) 47, which are arranged in a matrix and spaced from one another be fine intervals. In this case, a marginal region formed between two adjacent memory cell groups 47 (marginal portion in which no circuit pattern is formed) may be used as a microscopic region RM. It is preferable that the width Ws of the marginal region be greater than or equal to the resolution of the position detection system employed. In other words, a microscopic region that substantially differs from its adjacent region on the wafer (adjacent region in a broad concept meaning that an adjacent region does not necessarily have to be in contact with the microscopic region) in pattern density may be used as a position detection mark. In the example shown in FIG. 10, the pattern density of the marginal region is 0 (the marginal region has no pattern). Alternatively, a region that has a lower pattern density than memory cell groups 47 arranged at its two sides may also be used as a microscopic region RM.

Circuit patterns corresponding to nine LSI circuit patterns 41 have been formed in the pattern field (not shown) of the mark M used to expose the circuit patterns 41 in FIG. 7. To select a plurality of microscopic regions RM used as position detection marks, a plurality of microscopic regions including, for example, rectangular pattern parts (in a broad concept meaning that space portions in patterns or marginal regions between two adjacent memory cell groups are included) may be selected from the patterns of the mask M corresponding to the patterns formed in the unit exposure field ER prior to the processes of the exposure method of the present embodiment. In this region extraction process (region specification process), a plurality of microscopic regions that function as position detection marks are extracted from the pattern data corresponding to the circuit patterns formed in the unit exposure field ER.

More specifically, the microscopic regions RM extracted in the region extraction process are pattern data corresponding to one or more circuit patterns formed in the unit exposure field ER. This pattern data may be design data of one circuit pattern formed through any one of earlier performed lithography processes or may be design data of a plurality of circuit patterns formed through a plurality of earlier performed lithography processes.

Referring now to FIG. 6, in the position detection process S13, the XY-stage 3 is driven to align a specific unit exposure field ER of the wafer W with the detection range 10f of the position detection system 10 (S13a). The plurality of position detection mechanisms forming the position detection system 10 then detect the wafer-in-plane-direction positions of the plurality of microscopic regions RM in the unit exposure field ER (S13b). The positions of all the microscopic regions RM in the unit exposure field ER may be detected at the same time (substantially simultaneously) by position detection mechanisms, the quantity of which is equal to that of the microscopic regions RM. Alternatively, the positions of all the microscopic regions RM may be detected through the detection operation performed a number of times.

Further, in the detection process S13b, the positions of selected ones of the many microscopic regions RM in the unit exposure field ER may be simultaneously detected by position detection mechanisms, the quantity of which corresponds to the number of selected microscopic regions RM, or may be detected a number of times. Another unit exposure field ER of the wafer W may be aligned with the detection range 10f of the position detection system 10 when necessary and the position detection operation of the positions of a plurality of microscopic regions RM in the other unit exposure field ER may be repeated (S13c).

The exposure method of the present embodiment includes the calculation of the state of deformation occurring in the unit exposure field ER of the wafer W based on the position information obtained in the position detection process S13 (S14). In the deformation calculation process S14, the deformation calculation unit 11, which has received the detection result of the position detection system 10, calculates a position deviation amount of each of the plurality of microscopic regions RM in the unit exposure field ER of the wafer W from the corresponding reference position, and approximates non-linear deformation occurring in the unit exposure field ER with a function based on the information on the position deviation amount of each microscopic region RM. In the deformation calculation process S14, the deformation state may be calculated for every unit exposure field that has been subjected to the position detection process S13.

In this manner, the positions of the predetermined number of microscopic regions RM, which are included in the unit exposure field ER in the predetermined distribution, are detected, for example, at the same time using the plurality of position detection mechanisms in the position detection process S13. This enables nonlinear deformation occurring in the unit exposure field ER, or nonlinear deformation occurring in the LSI circuit patterns, to be measured (calculated) rapidly and accurately in the deformation calculation process S14. The position detection process S13 may be performed for a plurality of unit exposure fields ER defined on the wafer W. In this case, the alignment process S12 described above may be eliminated.

The exposure method of the present embodiment includes modifying the shape of a bright-dark pattern that is exposed on the wafer W as required based on information on the deformation state obtained in the deformation calculation process S14 (S15). When the unit exposure field ER of the wafer W has been deformed during, for example, wafer processing, the existing circuit patterns formed in the unit exposure field ER are also deformed and deviated from the desired design patterns. Thus, when the state of deformation occurring in the unit exposure field ER exceeds its allowable range, a new circuit pattern (bright-dark pattern) exposed on the existing circuit patterns in the unit exposure field ER would not obtain a high superimposition accuracy with the existing circuit patterns.

With the exposure method of the present embodiment, the reflection surface of at least one of the plane mirrors M1 and M2 is modified as required based on an instruction provided from the main control system 7 in the shape modification process S15. This actively generates, for example, a predetermined amount of deformation in the projection optical system PL. As a result, the shape of the bright-dark pattern to be exposed in the unit exposure field ER is modified in correspondence with the deformation of the existing circuit patterns in the unit exposure field ER.

Finally, the exposure method of the present embodiment includes repeating the projection exposure for each unit exposure field ER of the wafer W (S16). As a general rule, the same circuit pattern is exposed in each unit exposure field ER. Thus, when the deformation that occurs in each unit exposure field ER does not substantially depend on the position of each unit exposure field ER on the wafer W and mainly depends on the characteristics of the circuit pattern exposed in each unit exposure field ER, such as in-plane density distribution of the circuit pattern, the state of deformation occurring in one representative unit exposure field obtained in the deformation calculation process S14 is used to generate the desired aberration of the projection optical system PL. In this state, the projection exposure is repeated for each unit exposure field ER. Alternatively, in this case, the projection exposure process S16 may repeat the projection exposure for each unit exposure field ER while the shape modification process S15 maintaining a constant desired aberration of the projection optical system PL based on the average of values representing the state of deformation occurring in the plurality of unit exposure fields obtained in the deformation calculation process S14.

When the deformation that occurs in each unit exposure field ER depends on the position of each unit exposure field ER on the wafer W (e.g., depends on whether the unit exposure field ER is located at a middle position, a peripheral position, or the like on the wafer W), in the projection exposure process S16, the aberration of the projection optical system PL is modified as required based on the state of deformation occurring in each of the plurality of unit exposure fields located at different positions on the wafer W while repeating the projection exposure. Alternatively, in this case, the projection exposure process S16 may repeat the projection exposure for each unit exposure field ER while adjusting the aberration of the projection optical system PL for every unit exposure field based on the state of deformation occurring in each unit exposure field of the wafer W.

As described above, in the exposure method of the present embodiment, the position detection system (position detection mechanisms) 10 for detecting a plurality of positions that fall within a range substantially equal to each unit exposure field ER of the wafer W is used to detect the wafer-in-plane direction positions of a plurality of microscopic regions RM including the existing circuit patterns formed in the unit exposure field ER. Based on position information (position detection values) on the plurality of microscopic regions RM that function as position detection marks, the state of deformation occurring in each unit exposure field ER is calculated, and nonlinear deformation occurring in the existing circuit pattern formed in the unit exposure field ER is consequently measured.

Accordingly, in the present embodiment, the shape of the bright-dark pattern exposed onto the unit exposure field is modified in correspondence with the deformation of the existing circuit patterns in the unit exposure field ER. This improves the superimposition accuracy of the existing circuit patterns and the newly exposed pattern on the wafer W. As a result, the exposure method of the present embodiment enables rapid and accurate detection of nonlinear deformation occurring in the unit exposure field ER based on the predetermined number of microscopic regions RM arranged in the predetermined distribution and enables patterns to be overlaid on one another on the wafer W with high accuracy.

In the above embodiment, the state of deformation occurring in the unit exposure field ER is calculated by detecting the wafer-in-plane direction positions of the plurality of microscopic regions RM including the existing circuit patterns formed in the unit exposure field ER. However, the state of deformation occurring in the unit exposure field may be calculated by detecting positions of a plurality of position detection marks PM formed in a street line (or a "cutting margin" portion between the chips) of the unit exposure field ER or by detecting positions of a plurality of position detection marks formed in a marginal region within each circuit pattern corresponding to a functional element in the unit exposure field in addition to detecting the positions of the plurality of microscopic regions.

Figure 11:
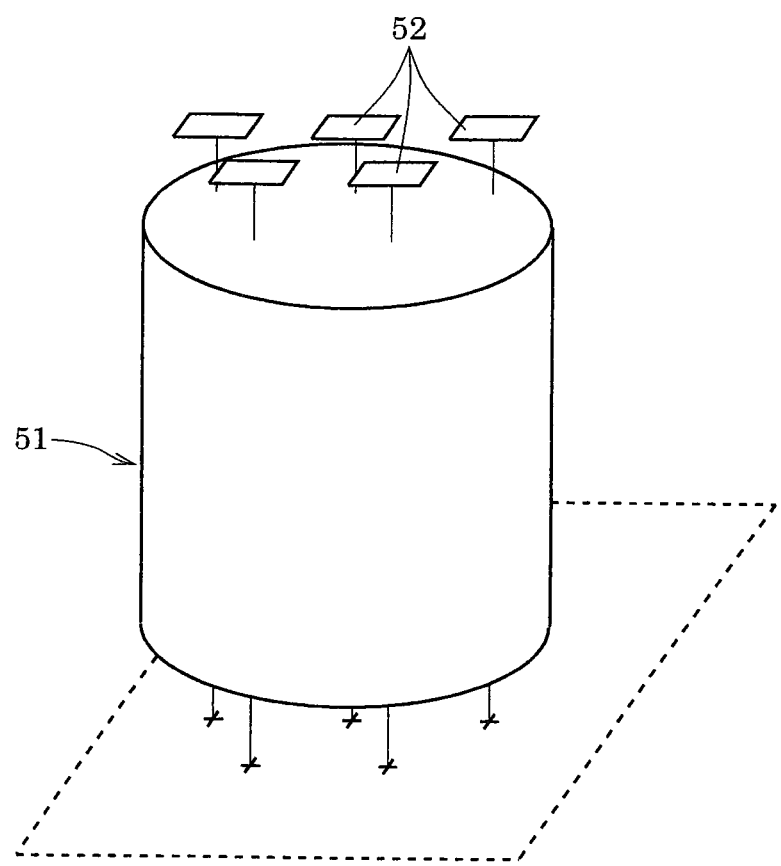
FIG. 11 is a schematic diagram showing a position detection system according to a modification of the present invention.

In the above embodiment, the plurality of detection optical systems (32 to 34) that are arranged next to each other in a two-dimensional manner and the photoelectric detectors 35, the quantity of which is the same as that of the detection optical systems, form the plurality of position detection mechanisms. However, the present invention is not limited in such a manner, and the number, arrangement, and structure of the position detection mechanisms may be modified in various manners. As one example, a single common detection optical system 51, which is commonly used to detect the positions of a plurality of microscopic regions that function as position detection marks, and a plurality of imaging devices (photodetectors) 52, which are arranged in and above a detection range (or a viewing field with which a satisfactory image is produced) of the common detection optical system 51, may form a plurality of position detection mechanisms as shown in FIG. 11. The common detection optical system 51 is one example of a common detection lens barrel unit. The imaging devices 52 are one example of detection units. Although the plurality of imaging devices 52, which are independent of one another, are used in the example shown in FIG. 11, a plurality of portions of an imaging plane of a single imaging device may be used as photodetectors instead of the plurality of independent imaging devices 52. The structure in the example shown in FIG. 11 may be changed to include a plurality of common detection optical systems 51, or to additionally include one or more position detection mechanisms having the structure shown in FIG. 2.

Figure 12:
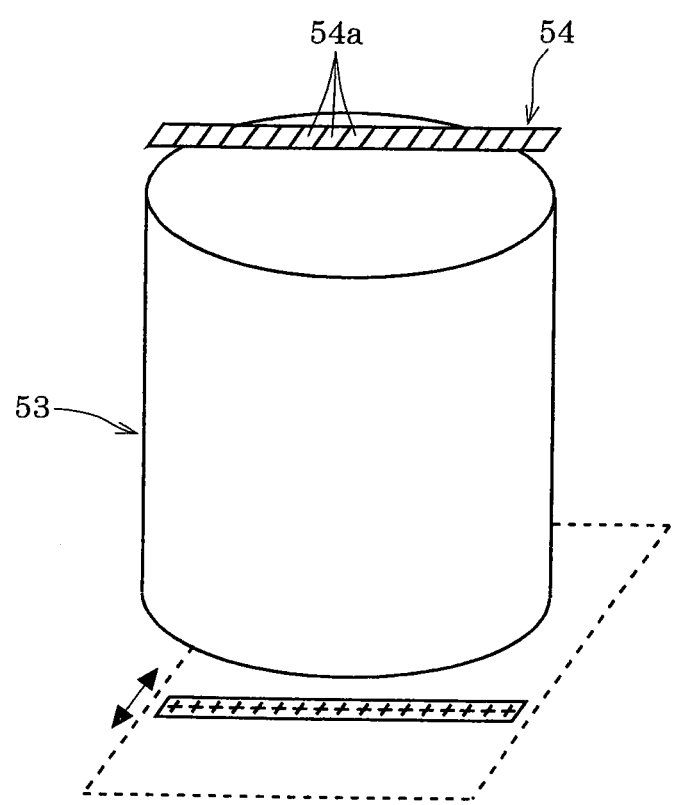
FIG. 12 is a schematic diagram showing a position detection system according to another modification of the present invention.

Alternatively, a single common detection optical system 53, which is commonly used to detect the positions of a plurality of microscopic regions that function as position detection marks, and a line sensor (photodetector) 54, which is formed by for example a plurality of imaging devices 54a arranged in one direction to detect light with the common detection optical system 53, may form a plurality of position detection mechanisms as shown in FIG. 12. In this case, the positions of the plurality of microscopic regions are detected by performing scanning while moving the wafer W with the XY-stage 3 with respect to the common detection optical system 53 in a direction orthogonal to the direction in which the plurality of imaging devices 54a are arranged. The structure in the example shown in FIG. 12 may be changed to include a plurality of common detection optical systems 53, include a plurality of imaging devices 54a that are arranged next to each other in a two-dimensional manner in the single line sensor 54, or include a plurality of line sensors 54 arranged next to each other.

Although the imaging-device-based position detection mechanisms are used in the above embodiment, the present invention is not limited to such a structure. The detection method of the position detection mechanisms may be modified in various manners. For example, a laser-scanning position detection mechanism may be used to detect the position of a position detection mark that is formed, for example, by a line pattern by scanning the position detection mark with a slit laser beam spot and detecting light scattered from the position detection mark with a photodetector. Alternatively, a grating-alignment position detection mechanism may be used to measure the position of a position detection mark that is formed for example by a line-and-space pattern by illuminating the position detection mark with detection light and detecting light diffracted from the position detection mark using a photodetector. The wavelength of the detection light is not limited to the visible light range or the ultraviolet light range, and light with other wavelengths such as X-rays may be used. Additionally, imaging position detection mechanisms using an electron beam or electron beam position detection mechanisms for detecting scattered electrons generated through electron beam irradiation may be used. One such example is an electron microscope.

Although the optical surface shape modification unit 12 modifies the shape of the reflection surfaces of the plane mirrors M1 and M2 formed by deformable mirrors as required, the present invention is not be limited to such a structure. For example, the optical surface shape modification unit 12 may modify the shape of the optical surface of the projection optical system as required by using appropriate means other than deformable mirrors. In the above embodiment, the optical surface shape modification unit 12 appropriately modifies the shape of the reflection surface of the plane mirror M1 or M2 to modify the aberration of the projection optical system PL and modify the shape of a bright-dark pattern exposed on the wafer W. However, the present invention is not be limited to such a structure. The optical surface shape modification unit 12 may generate a predetermined amount of distortion of the projection optical system PL by modifying the shape of at least one optical surface arranged at a position near the object plane of the projection optical system, optically conjugate to the object plane, near to the conjugate position, or near the image plane of the projection optical system. As another example of the optical surface in this case, a plane-parallel glass plate may be arranged at each of the above positions. The predetermined amount of deformation may be generated by deforming each plane-parallel glass plate (or deforming the surface of each plane-parallel glass plate) and using refraction of each plane-parallel glass plate.

In this manner, the aberration of the projection optical system can be modified and the shape of a bright-dark pattern exposed on the substrate can be modified by modifying the shape of at least one optical surface of the projection optical system. Further, the shape of the bright-dark pattern exposed on the substrate can also be modified by modifying the aberration of the projection optical system. The shape of the bright-dark pattern exposed on the substrate can also be modified by modifying the shape of the pattern surface of the mask in addition to or instead of modifying the aberration of the projection optical system.

Although the embodiment according to the present invention is applied to the one-shot exposure method for performing one-shot exposure of the pattern of the mask M in each unit exposure field of the wafer W in the above embodiment, the application of the present invention is not limited to the one-shot exposure method. The embodiment according to the present invention may be applied to a scanning exposure method for performing scanning exposure of the pattern of the mask M in each unit exposure field of the wafer W. In this case, the shape of a bright-dark pattern exposed on the substrate may be modified in accordance with the relative movement of the substrate during scanning exposure.

Although the embodiment according to the present invention is applied to the exposure method using the mask M on which a transferred pattern is formed, the application of the present invention is not limited to the method using the mask M. The present invention may also be applied to maskless exposure. In this case, a variable shape mask with which a predetermined pattern is formed based on predetermined electronic data may be used instead of a normal mask. A reflective spatial light modulator that is driven based on predetermined electronic data (e.g., a digital micromirror device) may be used for example as the variable shape mask. An exposure apparatus that uses such a reflective spatial light modulator is described, for example, in U.S. Pat. No. 5,523,193. Alternatively, a transmissive spatial light modulator or a light-emitting image display element may be used instead of the reflective spatial light modulator. The use of such a variable shape mask is advantageous in that the shape of the pattern on the variable shape mask can be modified by processing electron data input to the variable shaped mask so that the shape of a bright-dark pattern can be modified without deforming a predetermined surface of the projection optical system.

The exposure apparatus used to perform the exposure method of the above embodiment is fabricated by assembling various subsystems including the components described above to maintain predetermined mechanical precision, electric precision, and optical precision. To maintain the mechanical, electric, and optical precisions, the optical systems are adjusted to obtain the required optical precision, the mechanical systems are adjusted to obtain the required mechanical precision, and the electric systems are adjusted to obtain the required electric precision. The process of assembling the subsystems into the exposure apparatus includes mechanically connecting the subsystems to one another, wiring the electric circuits, and piping the pressure circuits. Processes of assembling the subsystems are performed before the assembling process for the subsystems into the exposure apparatus. After the process of assembling the subsystems into the exposure apparatus is completed, the apparatus is subjected to overall adjustment to maintain precision. The exposure apparatus is preferably fabricated in a clean room under conditions such as temperature and cleanness that are controlled.

In the exposure method of the above embodiment, the mask (reticle) is illuminated with the illumination unit (illumination process) and a transfer pattern formed on the mask is exposed onto the photosensitive substrate with the projection optical system (exposure process) to manufacture electronic devices (including semiconductor devices, imaging devices, liquid crystal display devices, and thin-film magnetic heads). One example of a method for manufacturing an electronic device, or specifically a semiconductor device, through formation of a predetermined circuit pattern on a photosensitive substrate, such as a wafer, with the exposure method of the present embodiment will now be described with reference to the flowchart shown in FIG. 13.

Figure 13:
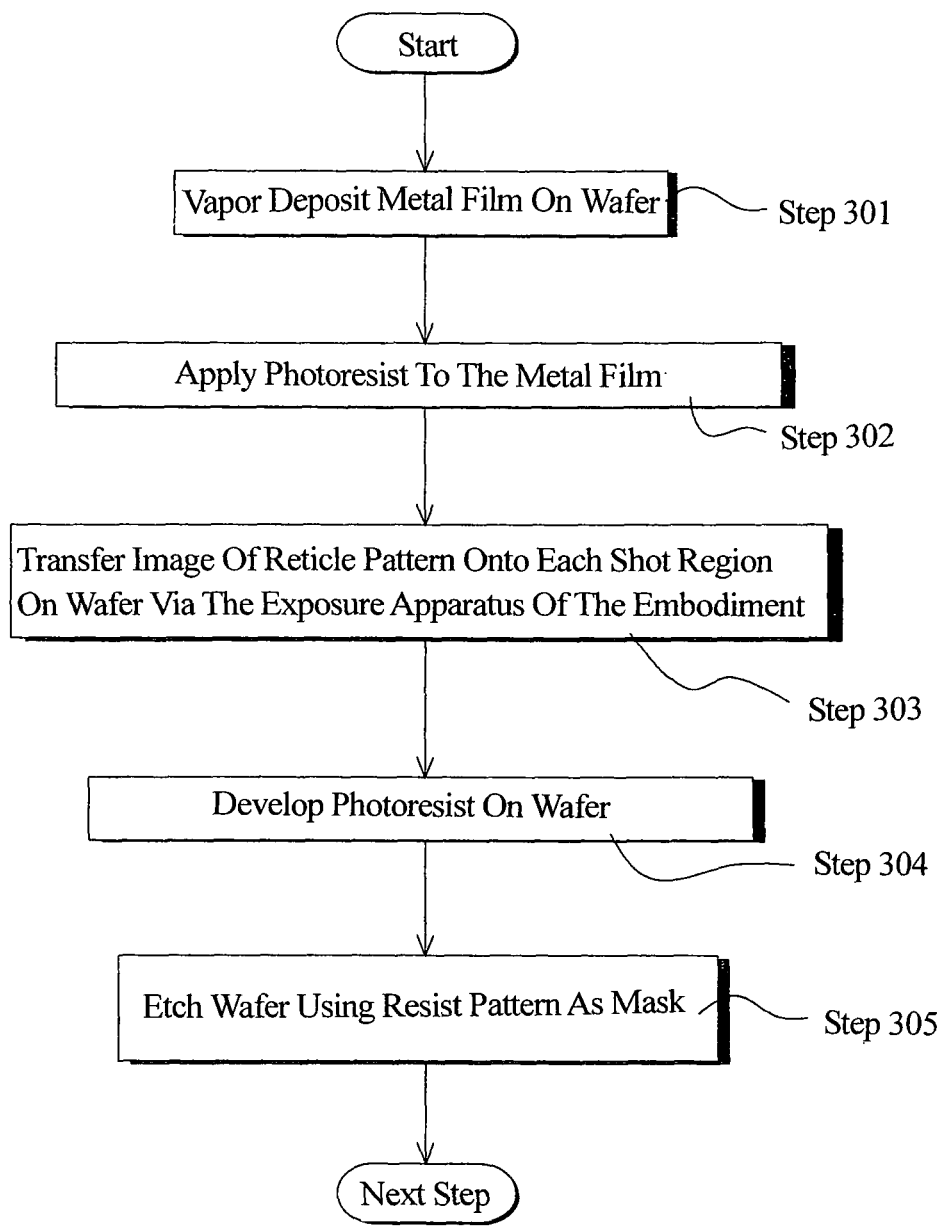
FIG. 13 is a flowchart illustrating a method for manufacturing a semiconductor device.

In step S301 in FIG. 13, a metal film is first formed on wafers of a first lot through vapor deposition. In step S302, photoresist is applied to the metal film formed on each wafer of the first lot. In step S303, an image of a pattern formed on a mask is exposed and transferred sequentially onto shot-regions of each wafer of the first lot using the projection optical system with the exposure method of the present embodiment. In step S304, the photoresist formed on each wafer of the first lot is developed. In step S305, each wafer of the first lot is etched using the resist pattern formed on the wafer as a mask. This forms a circuit pattern corresponding to the mask pattern in the shot-regions of each wafer.

Afterwards, circuit patterns corresponding to upper layers are formed on the structure to complete the semiconductor device or the like. With the semiconductor device manufacturing method described above, a semiconductor device with a fine circuit pattern is manufactured with a high throughput. In steps S301 to S305, metal is deposited on the wafer through vapor deposition, resist is applied to the metal film, and processes for exposing, developing, and etching the resist are then performed. However, before these processes, a silicon oxide film may be applied to the wafer, and then the resist may be applied to the silicon oxide film, and the processes in which the resist is exposed, developed, and etched may be performed.

Figure 14:
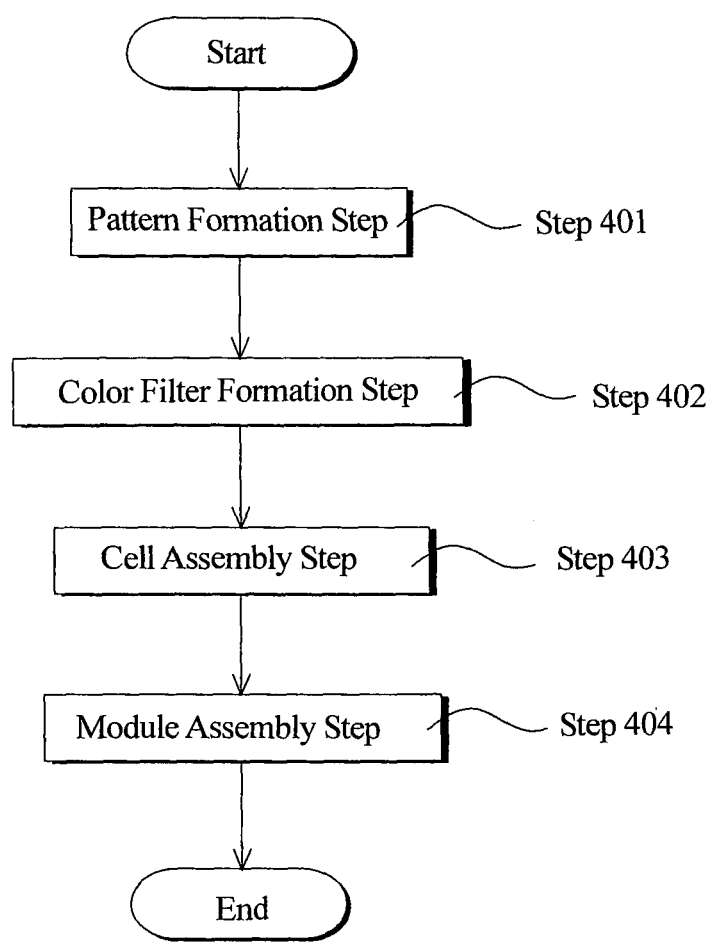
FIG. 14 is a flowchart illustrating a method for manufacturing a liquid crystal display device.

With the exposure method of the present embodiment, another type of electronic device, such as a liquid crystal display device, may be manufactured through formation of a predetermined pattern (a circuit pattern or an electrode pattern) on a plate (glass substrate). One example of such a method for manufacturing a liquid crystal display device will now be described with reference to the flowchart of FIG. 14. In FIG. 14, a pattern formation process is performed in step S401. In step S401, a mask pattern is transferred and exposed onto a photosensitive substrate (e.g., a glass substrate coated with resist) with the exposure method of the present embodiment. In other words, a photolithography process is performed. Through the photolithography process, a predetermined pattern including for example many electrodes is formed on the photosensitive substrate. Afterwards, a predetermined pattern is formed on the substrate through processes including a developing process, an etching process, and a resist removing process. Then, a color filter formation process is performed in step S402.

In the color filter formation process S402, a color filter is formed, for example, by arranging many sets of R (red), G (green), and B (blue) dots in a matrix, or arranging a plurality of sets of filters formed by R, G, and B stripes in horizontal scanning line directions. After the color filter formation process S402, a cell assembly process is performed in step S403. In step S403, the substrate having a predetermined pattern obtained through the pattern formation process S401 and the color filter or the like obtained through the color filter formation process S402 are assembled together to form the liquid crystal panel (liquid crystal cell).

In the cell assembly process S403, for example, liquid crystal is injected between the substrate having the predetermined pattern obtained through the pattern formation process S401 and the color filter obtained through the color filter formation process S402 to form the liquid crystal panel (liquid crystal cell). In a module assembly process performed subsequently in step S404, an electric circuit for enabling the assembled liquid crystal panel (liquid crystal cell) to perform a display operation and other components including a backlight are mounted to complete the liquid crystal display device. With the liquid crystal display device manufacturing method described above, a liquid crystal display device having a fine circuit patterns is manufactured with a high throughput.

The present invention should not be limited to the above embodiments but may be modified variously without departing from the scope and spirit of the present invention. Further, the contents of U.S. Provisional Patent Application No. 60/924,061, filed on Apr. 27, 2007, in the name of Naomasa Shiraishi, may be incorporated herein as part of the embodiment of the present invention.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An exposure method for exposing a pattern onto a unit exposure field among fields of a substrate through a projection optical system, the unit exposure field including circuit patterns of functional elements formed in the unit exposure field, the exposure method comprising:
   detecting positions of a plurality of microscopic regions in the unit exposure field in an in-plane-direction of the substrate;
   calculating a state of deformation in the unit exposure field based on the result of the detecting the positions of the plurality of microscopic regions; and
   modifying the shape of the pattern to be exposed onto the unit exposure field based on the result of the calculating the state of deformation;
   wherein the plurality of microscopic regions include two or more microscopic regions dispersed within a range of each of the circuit patterns of the functional elements formed in the unit exposure field, and
   wherein the microscopic regions dispersed within the range of each of the circuit patterns include a part of the corresponding circuit pattern of the functional element.

2. The exposure method according to claim 1, wherein at least one of the microscopic regions includes a brightness that substantially differs from that of an adjacent region on the substrate.

3. The exposure method according to claim 1, wherein at least one of the microscopic regions differs from a region adjacent to the one of the microscopic regions in whether or not a thin film of a predetermined material is formed on the substrate.

4. The exposure method according to claim 1, wherein at least one of the microscopic regions substantially differs from a region adjacent to the one of the microscopic regions in circuit pattern density.

5. The exposure method according to claim 4, wherein at least one of the microscopic regions each includes a periodic pattern having a pitch that is smaller than the resolution of a position detection system used in the detecting the positions of the microscopic regions in the in-plane-direction.

6. The exposure method according to claim 1, wherein at least one of the microscopic regions includes two sides having a length extending in a direction orthogonal to a scanning direction in which the position detection is performed, the length being greater than or equal to a first predetermined dimension, and the two sides have a width extending in the scanning direction that is greater than or equal to a second predetermined dimension.

7. The exposure method according to claim 1, wherein the positions of at least four of the plurality of microscopic regions in the in-plane-direction are detected in the unit exposure field.

8. The exposure method according to claim 1, wherein the positions of the plurality of microscopic regions in the in-plane-direction are detected through a plurality of position detection mechanisms arranged next to one another.

9. The exposure method according to claim 8, wherein the plurality of position detection mechanisms each include a detection lens barrel unit and a detection unit.

10. The exposure method according to claim 8, wherein at least one of the plurality of position detection mechanisms includes a detection lens barrel unit and a plurality of detection units that detect light through the detection lens barrel unit.

11. The exposure method according to claim 1, wherein the positions of the plurality of microscope regions in the in-plane-direction are detected via a common detection lens barrel unit and a plurality of detection units, arranged next to one another to detect light through the common detection lens barrel unit.

12. The exposure method according to claim 11, wherein the positions of the plurality of microscopic regions in the in-plane-direction are detected while moving the substrate relative to the common detection lens barrel unit.

13. The exposure method according to claim 1, the shape of the pattern to be exposed is deformed by in a nonlinear shape.

14. The exposure method according to claim 1, wherein the shape of the pattern to be exposed is deformed by modifying aberration of the projection optical system.

15. The exposure method according to claim 1, wherein the shape of the pattern to be exposed is deformed by modifying the shape of at least one optical surface in the projection optical system.

16. The exposure method according to claim 15, wherein the at least one optical surface is an optical surface arranged at a position near an object plane of the projection optical system, a position optically conjugate to the object plane, a position near the conjugate position, or a position near an image plane of the projection optical system.

17. The exposure method according to claim 1, wherein the pattern formed on the substrate is an image of a pattern formed on a mask.

18. The exposure method according to claim 1, wherein the shape of the pattern to be exposed is deformed by modifying the shape of a pattern surface of a mask arranged on an object plane of the projection optical system.

19. The exposure method according to claim 1, wherein the projection optical system has a reduction magnification.

20. The exposure method according to claim 1, further comprising:
exposing the pattern on the substrate while moving the substrate relative to the projection optical system in a predetermined direction;
wherein the shape of the pattern to be exposed is deformed in accordance with the relative movement of the substrate during the scanning exposure.

21. A method for manufacturing an electronic device, the method comprising:
a lithography step using the exposure method according to claim 1.

22. The electronic device manufacturing method according to claim 21, wherein the positions of the microscopic regions in the in-plane-direction are detected based on pattern data corresponding to the circuit pattern of the functional element formed in the unit exposure field on the substrate.

23. The electronic device manufacturing method according to claim 22, wherein the pattern data is design data for the circuit pattern of the functional element formed in the unit exposure field in one of earlier lithography steps.

24. The electronic device manufacturing method according to claim 22, wherein the pattern data is design data for a plurality of circuit patterns formed in the unit exposure field in a plurality of earlier lithography steps.

25. The exposure method according to claim 1, wherein at least one of the microscopic regions includes a line portion or space portion in a cyclic pattern of the circuit pattern of the functional element.

26. The exposure method according to claim 1, wherein the circuit pattern of the functional element includes a plurality of cyclic patterns, and wherein at least one of the microscopic regions includes one of the plurality of cyclic patterns that has a first pitch and is arranged between adjacent ones of the plurality of cyclic patterns that have a second pitch.

27. The exposure method according to claim 1, wherein at least one of the microscopic regions includes a marginal region between adjacent first and second pattern fields of the circuit pattern of the functional element.

28. The exposure method according to claim 1, wherein the state of deformation is calculated using a high-order function.

29. The exposure method according to claim 1, wherein the positions of the microscopic regions in the in-plane-direction are detected at the same time.

30. The exposure method according to claim 1, wherein the microscopic regions are arranged in a substantially uniform distribution within the range of each of the circuit patterns.

31. The exposure method according to claim 1, wherein the microscopic regions are arranged in a distribution of many microscopic regions in a peripheral portion of the corresponding circuit pattern than a central portion of the corresponding circuit pattern within the range of each of the circuit patterns.

32. The exposure method according to claim 1, wherein the position detection step includes detecting the positions of the plurality of microscopic regions without through the projection optical system.

* * * * *